US009960100B2

(12) United States Patent
Arai et al.

(10) Patent No.: US 9,960,100 B2
(45) Date of Patent: May 1, 2018

(54) COOLER AND SEMICONDUCTOR MODULE USING SAME (71) Applicant: FUJI ELECTRIC CO., LTD., Kawasaki-shi, Kanagawa (JP)

(72) Inventors: Nobuhide Arai, Matsumoto (JP); Hiromichi Gohara, Matsumoto (JP)

(73) Assignee: FUJI ELECTRIC CO., LTD, Kanagawa (JP)

(*) Notice: Subject to any disclaimer, the term of this patent is extended or adjusted under 35 U.S.C. 154(b) by 0 days. days.

(21) Appl. No.: 15/027,419

(22) PCT Filed: Mar. 18, 2015

(86) PCT No.: PCT/JP2015/058023
§ 371 (c)(1),
(2) Date: Apr. 5, 2016

(87) PCT Pub. No.: WO2015/141714
PCT Pub. Date: Sep. 24, 2015

(65) Prior Publication Data
US 2016/0379914 A1 Dec. 29, 2016

(30) Foreign Application Priority Data
Mar. 20, 2014 (JP) .................................. 2014-057802

(51) Int. Cl.
*H01L 23/34* (2006.01)
*H01L 23/36* (2006.01)
(Continued)

(52) U.S. Cl.
CPC ............ *H01L 23/473* (2013.01); *H01L 25/07* (2013.01); *H01L 25/072* (2013.01); *H01L 25/18* (2013.01);
(Continued)

(58) Field of Classification Search
CPC ......... H01L 23/34; H01L 23/36; H01L 23/46; H01L 23/467; H01L 23/473; H01L 23/427; H01L 23/433
See application file for complete search history.

(56) References Cited

U.S. PATENT DOCUMENTS 4,765,397 A * 8/1988 Chrysler ............... H01L 23/473
165/104.33
5,613,552 A * 3/1997 Osakabe ............. F28D 15/0233
165/104.21
(Continued)

FOREIGN PATENT DOCUMENTS

CN 102054808 A 5/2011
JP 2008187754 A 8/2008
(Continued)

OTHER PUBLICATIONS

Japanese Office Action (and English translation thereof) dated Jun. 6, 2017 issued in counterpart Japanese Application No. 2016508756.
(Continued)

Primary Examiner — David Zarneke
(74) Attorney, Agent, or Firm — Holtz, Holtz & Volek PC (57) ABSTRACT A cooler includes: a jacket having an internal coolant conduction space surrounded by a main cooling surface top plate, an opposite bottom plate, and a side wall; coolant inflow and outflow pipes connected to two through holes in the side wall; a coolant introduction channel forming a part of the coolant conduction space and communicating with the coolant inflow pipe; a coolant discharge channel forming a part of the coolant conduction space and communicating with the coolant outflow pipe; and a fin unit between the coolant introduction and discharge channels. The fin unit includes a plurality of fins having separate main surfaces and thermally connected to the top plate. The fins have first ends (Continued)

acutely angled relative to a direction of flow of coolant in the coolant introduction channel, and second ends acutely angled relative to a direction of flow of coolant in the coolant discharge channel.

12 Claims, 6 Drawing Sheets

(51) Int. Cl.

| | | |
|---|---|---|
| *H01L 23/46* | (2006.01) | |
| *H01L 23/467* | (2006.01) | |
| *H01L 23/473* | (2006.01) | |
| *H01L 23/433* | (2006.01) | |
| *H01L 25/07* | (2006.01) | |
| *H01L 25/18* | (2006.01) | |
| *H01L 23/427* | (2006.01) | |
| *H01L 23/367* | (2006.01) | |

(52) U.S. Cl.
CPC ............. *H01L 23/34* (2013.01); *H01L 23/36* (2013.01); *H01L 23/367* (2013.01); *H01L 23/427* (2013.01); *H01L 23/433* (2013.01); *H01L 23/46* (2013.01); *H01L 23/467* (2013.01); *H01L 2924/0002* (2013.01)

(56) References Cited

U.S. PATENT DOCUMENTS

| | | | | |
|---|---|---|---|---|
| 6,549,404 | B1* | 4/2003 | Kitahara | H01L 23/367 |
| | | | | 165/121 |
| 7,728,467 | B2* | 6/2010 | Aoki | H01L 21/4878 |
| | | | | 310/54 |
| 7,909,087 | B2* | 3/2011 | Kimura | F28F 3/02 |
| | | | | 165/80.3 |
| 9,245,821 | B2 | 1/2016 | Gohara et al. | |
| 9,293,391 | B2 | 3/2016 | Gohara et al. | |
| 9,818,673 | B2* | 11/2017 | Mizuno | H01L 23/473 |
| 2007/0107874 | A1* | 5/2007 | Peng | H01L 23/473 |
| | | | | 165/80.4 |
| 2008/0179972 | A1* | 7/2008 | Aoki | H01L 21/4878 |
| | | | | 310/52 |
| 2009/0260778 | A1* | 10/2009 | Ayotte | H01L 23/367 |
| | | | | 165/80.3 |
| 2010/0276135 | A1* | 11/2010 | Morino | B23P 15/26 |
| | | | | 165/185 |
| 2010/0320753 | A1* | 12/2010 | Uneno | B21D 39/04 |
| | | | | 285/331 |
| 2011/0094722 | A1* | 4/2011 | Mori | H01L 23/473 |
| | | | | 165/181 |
| 2013/0277012 | A1* | 10/2013 | Cruz | G06F 1/20 |
| | | | | 165/104.11 |
| 2014/0352937 | A1* | 12/2014 | Draht | G06F 1/20 |
| | | | | 165/168 |
| 2015/0189791 | A1* | 7/2015 | Tamura | B23P 15/26 |
| | | | | 165/148 |

FOREIGN PATENT DOCUMENTS

| | | |
|---|---|---|
| JP | 2011040554 A | 2/2011 |
| JP | 2012174963 A | 9/2012 |
| JP | 2013030713 A | 2/2013 |
| JP | 2013165298 A | 8/2013 |
| WO | 2013054887 A1 | 4/2013 |

OTHER PUBLICATIONS

International Search Report (ISR) dated Apr. 21, 2015 issued in International Application No. PCT/JP2015/058023.
Chinese Office Action dated Nov. 29, 2017 issued in counterpart Chinese Application No. 201580002170.6.

* cited by examiner

COOLER AND SEMICONDUCTOR MODULE USING SAME

TECHNICAL FIELD

The present invention relates to a cooler that improves cooling performance, and a semiconductor module using same.

BACKGROUND ART

The structures of Patent Documents 1 and 2 below, which are documents related to coolers capable of improving cooling performance, are known.

Patent Document 1 discloses a cooler that includes a cooling flow channel for cooling a part of an electronic component to be cooled, an introduction flow channel for introducing a cooling medium from an inlet port into the cooling flow channel, and a discharge flow channel for discharging the cooling medium from the cooling flow channel to an outlet port, and the area of the flow channel of the introduction flow channel and/or the discharge flow channel is larger at a position, which is farther from either the inlet port or the outlet port than a predetermined position, than at the predetermined position.

Patent Document 2 discloses a cooler provided with a corrugated fin.

PRIOR ART DOCUMENTS

Patent Documents

[Patent Document 1] Japanese Laid-Open Patent Application No. 2012-174963 (FIG. 1)
[Patent Document 2] Japanese Laid-Open Patent Application No. 2013-165298 (FIG. 3)

DISCLOSURE OF THE INVENTION

Problems to be Solved by the Invention

A problem with Patent Document 1 is that because the structure is such that the area of the flow channel of at least one of the introduction flow channel or the discharge flow channel is larger at a position, which is farther from either the inlet port or the outlet port than a predetermined position, than at the predetermined position, pressure loss in the vicinity of the inlet port and the outlet port increases, and the dynamic force of a pump that causes the conduction of the coolant becomes larger. The problem is that in order to reduce the dynamic force of the pump, the area of the flow channels in the vicinity of the inlet port and the outlet port must be enlarged, resulting in the cooler becoming larger.

A problem with Patent Document 2 is that because the coolant outlet side end of the fin is bent in the direction of the coolant discharge, fluctuation of the coolant flow at the coolant outlet side end of the fin decreases and the heat transfer performance of the cooler degrades, likewise with respect to the simulation results for a comparative example, which will be described below.

To overcome the aforementioned problems, an object of the present invention is to provide a cooler having improved cooling performance, and a semiconductor module in which same is used.

Means to Solve the Problems

In order to solve the aforementioned problems, the cooler according to the present invention is provided with: a jacket having a top plate that is a main cooling surface, a bottom plate that is disposed opposite the top plate, and a side wall that connects outer peripheries of the top plate and the bottom plate, the jacket being provided internally with a coolant conduction space that is surrounded by the top plate, the bottom plate, and the side wall; a coolant inflow pipe and a coolant outflow pipe respectively connected to two through holes provided in the side wall; a coolant introduction channel that forms a part of the coolant conduction space and communicates with the coolant inflow pipe; a coolant discharge channel that forms a part of the coolant conduction space and communicates with the coolant outflow pipe; and a fin unit located between the coolant introduction channel and the coolant discharge channel, the fin unit comprising a plurality of fins disposed having main surfaces separated from one another, and being thermally connected to the top plate, wherein the cooler is characterized in that first ends of the fins are disposed so as to be oriented at an acute angle relative to a direction of flow of coolant in the coolant introduction channel, and second ends of the fins are disposed so as to be oriented at an acute angle to a direction of flow of coolant in the coolant discharge channel.

According to this configuration, the coolant flows into the fin unit upon the flow direction at the first ends of the fins being changed at an acute angle from the direction of flow in the coolant introduction channel, and is discharged in the direction of flow in the coolant discharge channel upon the flow direction at the second ends of the fins being changed at an acute angle from the flow direction inside the fin unit. Therefore, the coolant flow fluctuates in the vicinity of the first and second ends, the fluctuation is propagated, and the coolant flows in a fluctuating manner between the fins in the center of the fin unit as well. In so doing, coolant heat transfer resistance decreases, and the heat transfer performance of the fins improves.

In the cooler according to the present invention, it is preferable that a baffle be disposed in the coolant discharge channel.

According to this configuration, the fluctuation of the flow of the coolant between the fin unit and the coolant discharge channel can be accelerated, thereby making it possible to improve the cooling performance of the cooler.

In the cooler according to the present invention, it is preferable that the height of the baffle be lower than the height of the coolant discharge channel.

According to this configuration, because the height of the baffle and the height of the coolant discharge channel differ, the coolant passes through a gap between the baffle and the top plate, or a gap between the baffle and the bottom plate. In so doing, pressure loss can be reduced in the channel through which the coolant flows toward the coolant outflow pipe from the fin unit.

In the cooler according to the present invention, it is preferable that the baffle be disposed in contact with the bottom plate.

According to this configuration, the strength of the bottom plate of the jacket is fortified by the baffle. The jacket material may be made of metal or plastic. When a metal jacket is manufactured, it is preferable that sheet metal be press molded so that a baffle section that protrudes from the bottom plate is integrally formed together with the bottom plate and the side wall. When molded from a plastic, it is preferable that the bottom plate and the baffle be integrally molded.

Otherwise, in the cooler according to the present invention, it is preferable that the baffle be disposed in contact with the top plate.

According to this configuration, since the heat of the top plate is transferred to the baffle, the heat transfer area can be increased, and the cooling performance of the cooler can be further improved.

In the cooler according to the present invention, it is preferable that the baffle be set apart from the side wall opposite the side wall to which the coolant outflow pipe connects.

According to this configuration, any increase in pressure loss can be alleviated even in a case where the baffle is heightened. Furthermore, in a case where the baffle and the coolant conduction space are the same height, the coolant flows toward the coolant outflow pipe after moving along the baffle.

In the cooler according to the present invention, it is preferable that the main surfaces of the fins be corrugated.

According to this configuration, the increase in the per-unit area of the fins can improve the transfer of heat from the fins to the coolant. In addition, when the corrugated fins connect to the top plate, the rigidity of the top plate can be improved and the thickness of the top plate can be made thinner than when a linear fin is used. Because the thickness of the top plate is reduced, heat resistance can be reduced and the cooling performance of the cooler can be improved.

Regarding the corrugated fins, it is preferable that the cooler according to the present invention comprise a first corrugated fin, and a second corrugated fin adjacent to the first corrugated fin, and that a convex portion of the second corrugated fin be closer to the first corrugated fin side than a line linearly joining adjacent concave portions of the first corrugated fin.

According to this configuration, a linear coolant channel can be prevented from being formed between the first corrugated fin and the second corrugated fin, and heat transfer efficiency can be improved between the corrugated fins and the coolant.

In the cooler according to the present invention, it is preferable that the direction of flow in the coolant introduction channel and the direction of flow in the coolant discharge channel be anti-parallel.

According to this configuration, the cooler can be made compact.

In the cooler according to the present invention, it is preferable that the coolant be a liquid.

According to this configuration, because specific heat is greater than with a gas coolant, the cooling performance of the cooler can be improved.

The semiconductor module according to the present invention is characterized in that a semiconductor module unit, in which a semiconductor element is disposed, is provided on the surface of the top plate opposite the surface to which the fin unit is connected.

According to this configuration, the heat of the semiconductor module unit can be efficiently transferred to the cooler, making it possible to increase the rated output of the semiconductor module.

Advantageous Effects of the Invention

According to the present invention, because the flow direction of coolant flowing into the fin unit from the coolant introduction channel and the flow direction of coolant flowing out from the fin unit to the coolant discharge channel are changed at an acute angle, the coolant flow fluctuates in the vicinity of the first ends and the second ends of the fins, and the coolant moves in a fluctuating manner between the fins in the center of the fin unit as well. In so doing, the heat transfer resistance of the coolant decreases, and the heat transfer performance of the fins improves.

BEST MODE FOR CARRYING OUT THE INVENTION

The embodiment of the semiconductor module according to the present invention will be described below while referring to the drawings. The same numerals and characters will be given to components that are the same, and duplicate descriptions will be omitted. Furthermore, the present invention is not limited to the embodiment described below, and can be implemented by appropriately modifying the embodiment without changing the gist thereof.

EXAMPLE 1

Figure 1:
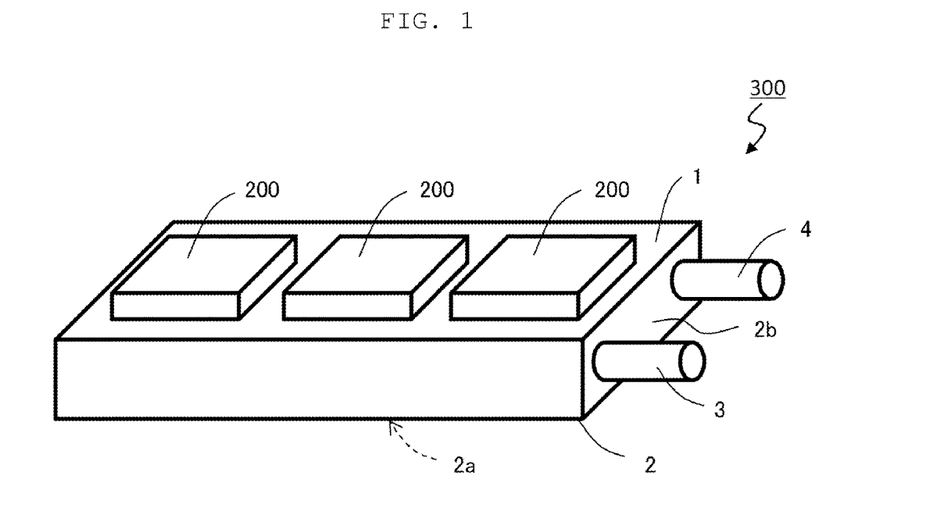
FIG. 1 is a bird's-eye view of a semiconductor module combining a cooler according to Example 1 of the present invention with a plurality of semiconductor module units.
Figure 2:
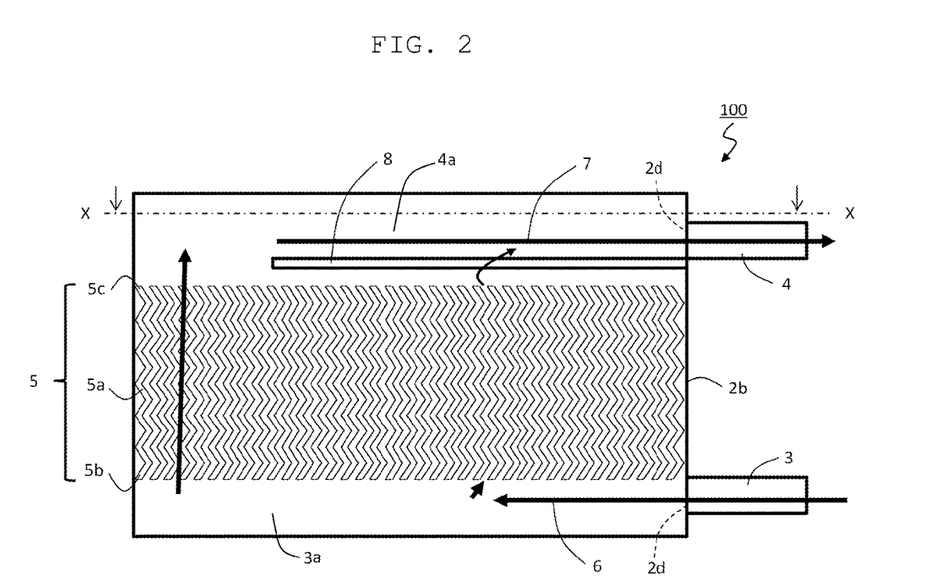
FIG. 2 is a plane view of the inside of the cooler according to Example 1 of the present invention.
Figure 3:
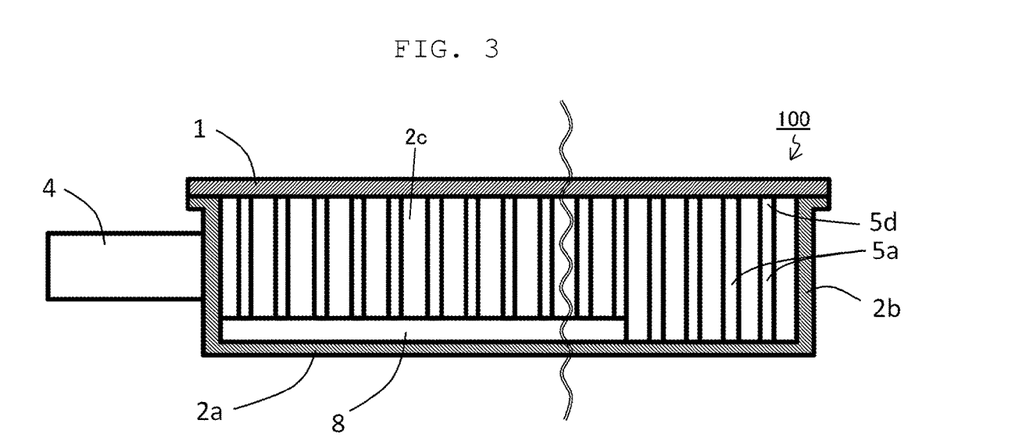
FIG. 3 is a cross-sectional view of the cooler according to Example 1 of the present invention.

Example 1 of the present invention will be described. FIG. 1 is a bird's-eye view of a semiconductor module combining a cooler according to Example 1 of the present invention with a plurality of semiconductor module units. FIG. 2 is a plane view of the inside of the cooler according to Example 1 of the present invention. FIG. 3 is a cross-sectional view of the cooler according to Example 1 of the present invention.

The cooler 100 according to Example 1 of the present invention is provided with: a jacket 2 inside which is provided a coolant conduction space 2c surrounded by a top plate 1, a bottom plate 2a, and a side wall 2b, an upper portion of the side wall 2b being joined to the rear surface of the top plate 1; a coolant inflow pipe 3 and a coolant outflow pipe 4 respectively connected to two through holes 2d provided in the side wall 2b; a coolant introduction channel 3a that forms a part of the coolant conduction space 2c and communicates with the coolant inflow pipe 3; a coolant discharge channel 4a that forms a part of the coolant conduction space 2c and communicates with the coolant outflow pipe 4; a fin unit 5 thermally connected to the top plate 1; and a baffle 8 disposed in a part of the coolant discharge channel 4a.

The fin unit 5 has a plurality of fins 5a, which, when viewed from above, are bent so as to be wave-shaped, and are disposed in a state in which the main surfaces thereof are separated from one another. First ends 5b of the fins 5a are disposed by being oriented so as to form an acute angle relative to a direction of flow 6 of coolant in the coolant introduction channel 3a, in other words, so that the direction in which coolant flows in along the first ends 5b is inclined in a return direction, and second ends 5*c* of the fins 5*a* are disposed by being oriented so as to form an acute angle relative to a direction of flow 7 of coolant in the coolant discharge channel 4*a*, in other words, so that the direction in which coolant flows out along the second ends 5*c* is inclined in the return direction. Then, third ends 5*d* positioned on the top plate 1 side of the fin unit 5 are thermally connected to the top plate 1.

The direction of flow 6 in the coolant introduction channel 3*a* and the direction of flow 7 in the coolant discharge channel 4*a* are anti-parallel.

The baffle 8 is disposed in the coolant discharge channel 4*a* at a height that is lower than the height of the coolant conduction space 2*c*, and is separated from the side wall opposite the side 2*b* to which the coolant outflow pipe 4 is connected.

As shown in FIG. 3, the baffle 8 is disposed in the coolant discharge channel 4*a* so as to make contact with the bottom plate 2*a*.

The main surfaces of the fins 5*a* of the fin unit 5 between the fins 5*a* ends 5*b* and 5*c* are corrugated. Thus, viewed from the top side of the cooler, the per-unit area of the fin can be increased, and the cooling capabilities of the cooler can be improved.

Fin spacing is determined by taking into account the diameter of particles that are likely to be mixed in with the coolant. In addition, it is preferable that the cooler comprising corrugated fins be structured so as to be provided with a first corrugated fin, and a second corrugated fin adjacent to the first corrugated fin, and that a convex portion of the second corrugated fin be closer to the first corrugated fin side than a line linearly joining adjacent concave portions of the first corrugated fin. In other words, it is preferable that the fin spacing be made so that a linear coolant channel can be prevented from being formed between the first corrugated fin and the second corrugated fin. Expressed as a formula, the fin spacing should satisfy Formula 1 and Formula 2 below.

$$L \leq Pf < H \qquad \text{Formula 1}$$

$$H = Pp/(2 \tan \theta) \qquad \text{Formula 2}$$

In the aforementioned Formulas 1 and 2, L signifies the smallest corrugated fin spacing for preventing clogging from occurring between the corrugated fins, Pf signifies fin spacing, Pp signifies the distance between the adjacent vertices of the corrugated fin, H signifies the distance between the line linearly joining the vertices of the concave portion of the corrugated fin and the vertex of the convex portion of the same corrugated fin, in other words, the amplitude of the corrugated fin, and θ signifies an angle formed between the flow direction 7 in the coolant discharge channel 4*a* and the second ends 5*c* of the corrugated fins 5*a*.

In the present example, a simulation using an angle θ of 65 degrees, and a fin spacing of 0.9 mm was carried out in a simulation experiment, described below.

EXAMPLE 2

Figure 4:
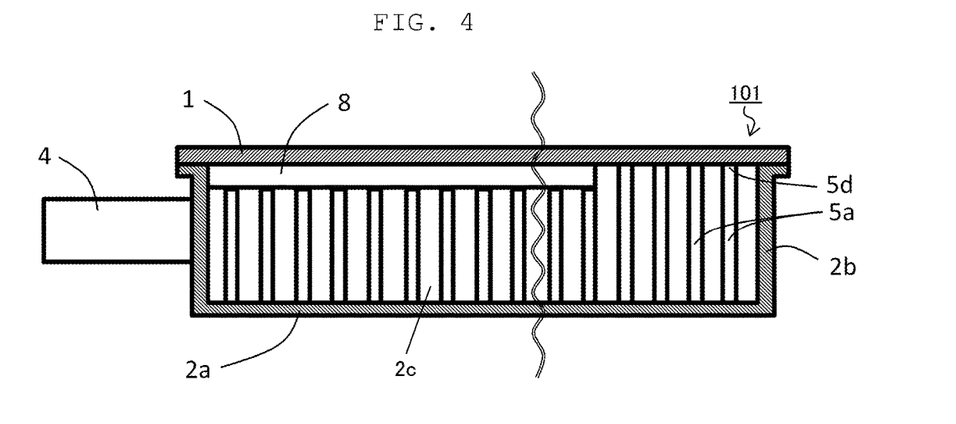
FIG. 4 is a cross-sectional view of the cooler according to Example 2 of the present invention.

Example 2 of the present invention will be described. FIG. 4 is a cross-sectional view of the cooler 101 according to Example 2 of the present invention. As shown in FIG. 4, in the cooler according to Example 2, the baffle 8 is disposed in the coolant discharge channel 4*a* in contact with the top plate 1. The other configurations of the cooler according to Example 2 are the same as Example 1.

EXAMPLE 3

Figure 5:
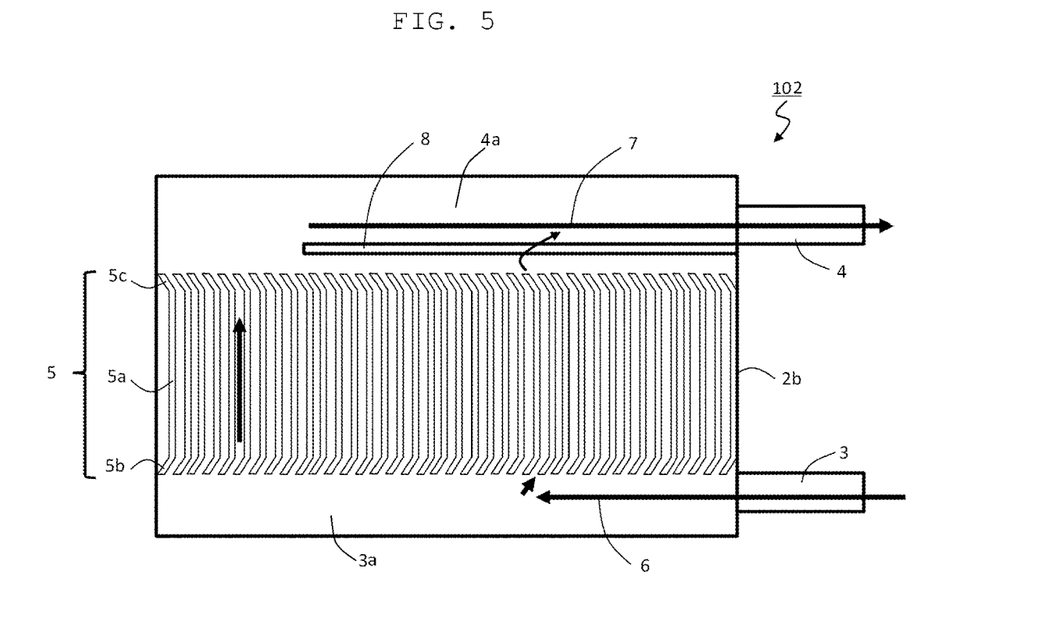
FIG. 5 is a plane view of the inside of the cooler according to Example 3 of the present invention.

Example 3 of the present invention will be described. FIG. 5 is a plane view of the inside of the cooler 102 according to Example 3 of the present invention. In the cooler 102 according to Example 3, the fin unit 5 differs from that of Example 1, but all the other sections are the same. That is, in the cooler 102 according to Example 3, the fins 5*a* are linear between the first ends 5*b* and the second ends 5*c*. Then, the same as Example 1, the first ends 5*b* of the fins 5*a* are disposed by being oriented so as to form an acute angle relative to the direction of flow 6 of coolant in the coolant introduction channel 3*a*, and the second ends 5*c* of the fins 5*a* are disposed by being oriented so as to form an acute angle relative to the direction of flow 7 of coolant in the coolant discharge channel 4*a*. The baffle 8 is disposed in the coolant discharge channel 4*a* so as to make contact with the bottom plate 2*a*, but the baffle 8 may be disposed so as to make contact with the top plate 1 the same as in Example 2.

COMPARATIVE EXAMPLE

Figure 6:
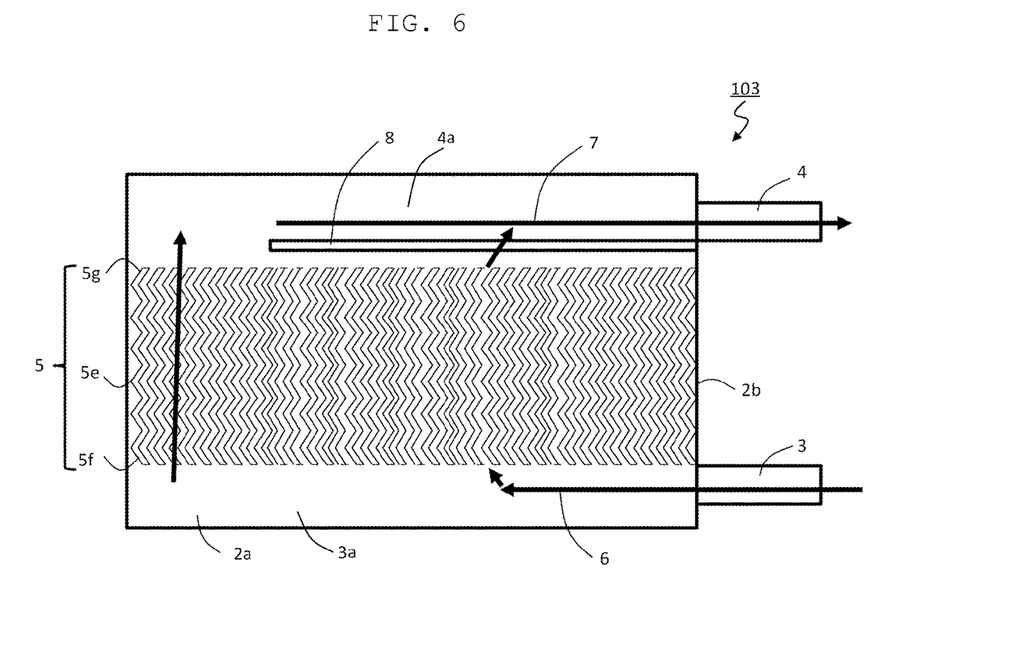
FIG. 6 is a plane view of the inside of the cooler according to a comparative example.

A Comparative Example will be described. FIG. 6 is a plane view of the inside of a cooler according to the Comparative Example. The cooler 103 related to the Comparative Example comprises the same configuration as Example 1 except for the fact that the fin unit 5 of the aforementioned Example 1 is reversed left to right. That is, in the fin unit 5 of the Comparative Example, a plurality of bent corrugated fins 5*e* is disposed in a state that separates the main surfaces thereof from one another, first ends 5*f* of the fins 5*e* are disposed by being oriented so as to form an obtuse angle relative to the direction of flow 6 of coolant in the coolant introduction channel 3*a*, in other words, so that the direction in which coolant flows in along the first ends 5*f* is inclined in the direction of forward movement, and second ends 5*g* of the fins 5*e* are disposed by being oriented so as to form an obtuse angle relative to the direction of flow 7 of coolant in the coolant discharge channel 4*a*, in other words, so that the direction in which coolant flows out along the second ends 5*g* is inclined in the direction of forward movement. Then, third ends positioned on the top plate 1 side of the fin unit 5 are thermally connected to the top plate 1.

When flow analysis using a simulation was implemented for the cooler according to Example 1 and the cooler according to the Comparative Example, the heat resistance of the semiconductor chip on the coolant outflow side was 0.145 (° C./W) in the Example 1 structure, and was 0.147 (° C./W) in the Comparative Example structure.

As described above, the Example 1 structure is capable of improving the cooling performance of the cooler 1.4% more than the Comparative Example structure.

EXAMPLE 4

Example 4, which gives an example of a semiconductor module according to the present invention, will be described by referring to FIG. 1. The semiconductor module 300 combines the cooler according to Example 1 of the present invention with a plurality of semiconductor module units. The semiconductor module 300 comprises a plurality of semiconductor module units 200 having semiconductor elements, the semiconductor module units 200 being provided on the surface opposite the surface of the top plate 1 of the cooler of Example 1 to which the fin unit 5 is disposed. The semiconductor module unit 200 is provided with at least one set of circuits configured by connecting an insulated gate bipolar transistor (IGBT) and a free wheeling diode (FWD) in an anti-parallel manner. A plurality of semiconductor module units 200 is combined with a single semiconductor module to configure a 3-phase inverter circuit. Otherwise, the configuration of the cooler is the same as the structure of the cooler of Example 1, and therefore a detailed description will be omitted.

As described above, according to the examples of the present invention, it is possible to provide a cooler that improves cooling performance, and a semiconductor module using same.

DESCRIPTION OF NUMERALS AND CHARACTERS

1 TOP PLATE
2 JACKET
2a BOTTOM PLATE
2b SIDE WALL
2c COOLANT CONDUCTION SPACE
2d THROUGH HOLE
3 COOLANT INFLOW PIPE
3a COOLANT INTRODUCTION CHANNEL
4 COOLANT OUTFLOW PIPE
4a COOLANT DISCHARGE CHANNEL
5 FIN UNIT
5a FIN
5b FIRST END OF FIN
5c SECOND END OF FIN
5d THIRD END OF FIN
6 COOLANT FLOW DIRECTION
7 COOLANT FLOW DIRECTION
8 BAFFLE
100 COOLER
101 COOLER
102 COOLER
103 COOLER
200 SEMICONDUCTOR MODULE UNIT
300 SEMICONDUCTOR MODULE

The invention claimed is:

1. A cooler comprising:
a jacket having a top plate that is a main cooling surface, a bottom plate that is disposed opposite the top plate, and a side wall that connects an outer periphery of the top plate and the bottom plate, the jacket being provided internally with a coolant conduction space that is surrounded by the top plate, the bottom plate, and the side wall, the side wall including a first side wall portion, a second side wall portion that is disposed opposite the first side wall portion, and a third side wall portion other than the first and second side wall portions;
a coolant inflow pipe connected to a through hole provided in the third side wall portion at a position closer to the first side wall portion than to the second side wall portion;
a coolant outflow pipe connected to a through hole provided in the third side wall portion at a position closer to the second side wall portion than to the first side wall portion;
a coolant introduction channel that forms a part of the coolant conduction space and communicates with the coolant inflow pipe, and is arranged such that a coolant can be introduced from the coolant inflow pipe along a first inner side wall provided by the first side wall portion inside the jacket;
a coolant discharge channel that forms a part of the coolant conduction space and communicates with the coolant outflow pipe, and is arranged such that the coolant can be outflowed from the coolant outflow pipe along a second inner side wall provided by the second side wall portion inside the jacket; and
a fin unit located between the coolant introduction channel and the coolant discharge channel, the fin unit being thermally connected to the top plate and comprising a plurality of fins having (i) main surfaces separated from one another to form a space therebetween, (ii) first end portions disposed to direct the coolant from the coolant introduction channel into the space between the main surfaces, and (iii) second end portions disposed to direct the coolant from the space between the main surfaces to the coolant discharge channel;
wherein:
all of the first end portions of the fins are disposed so as to extend away from the coolant introduction channel in a direction that forms an acute angle with a direction of flow of coolant in the coolant introduction channel such that a direction of flow of coolant in the first end portions is inclined toward a direction opposite the direction of flow of coolant in the coolant introduction channel, and
all of the second end portions of the fins are disposed so as to extend toward the coolant discharge channel in a direction that forms an acute angle with a direction of flow of coolant in the coolant discharge channel such that a direction of flow of coolant in the second end portions is inclined toward a direction opposite the direction of flow of coolant in the coolant discharge channel.

2. The cooler according to claim 1, wherein the cooler further comprises a baffle being disposed in the coolant discharge channel.

3. The cooler according to claim 2, wherein a height of the baffle is lower than a height of the coolant discharge channel.

4. The cooler according to claim 3, wherein the baffle is disposed in contact with the bottom plate.

5. The cooler according to claim 3, wherein the baffle is disposed in contact with the top plate.

6. The cooler according to claim 2, wherein the baffle is set apart from a fourth side wall portion of the side wall opposite the third side wall portion to which the coolant outflow pipe connects.

7. The cooler according to claim 2, wherein the main surfaces of the fins are corrugated.

8. The cooler according to claim 7, wherein the the plurality of fins comprise:
a first corrugated fin; and
a second corrugated fin adjacent to the first corrugated fin; wherein a convex portion of the second corrugated fin is closer to the first corrugated fin side than a line linearly joining adjacent concave portions of the first corrugated fin.

9. The cooler according to claim 1, wherein the direction of flow in the coolant introduction channel and the direction of flow in the coolant discharge channel are anti-parallel.

10. The cooler according to claim 1, wherein the coolant is a liquid.

11. A semiconductor module comprising the cooler according to claim 1, the semiconductor module comprising:

a semiconductor module unit, in which a semiconductor element is disposed, the semiconductor module unit being provided on a surface of the top plate opposite a surface to which the fin unit is connected.

12. The cooler according to claim 1, wherein:
all of the first end portions of the fins are bent so that all of the first end portions are oriented away from the third side wall portion in a direction facing the coolant introduction channel, and
all of the second end portions of the fins are bent so that all of the second end portions are oriented away from the third side wall portion in a direction facing the coolant discharge channel.

* * * * *

UNITED STATES PATENT AND TRADEMARK OFFICE
CERTIFICATE OF CORRECTION

PATENT NO. : 9,960,100 B2
APPLICATION NO. : 15/027419
DATED : May 1, 2018
INVENTOR(S) : Nobuhide Arai et al.

Page 1 of 1

It is certified that error appears in the above-identified patent and that said Letters Patent is hereby corrected as shown below:

On the Title Page

Item [*], after "0 days." delete "days.".

In the Specification

Column 5, Line 42, delete "$H \leq Pf < H$" and insert --$L \leq P f < H$--.

In the Claims

Column 8, Line 53, Claim 8, Line 1, delete "the the" and insert --the--.

Signed and Sealed this
Second Day of October, 2018

Andrei Iancu
*Director of the United States Patent and Trademark Office*